United States Patent [19]

Sakamoto

[11] 4,430,630
[45] Feb. 7, 1984

[54] TUNING CIRCUIT

[75] Inventor: Masaharu Sakamoto, Tokyo, Japan

[73] Assignee: Pioneer Electronic Corporation, Tokyo, Japan

[21] Appl. No.: 322,839

[22] Filed: Nov. 19, 1981

[30] Foreign Application Priority Data

Nov. 21, 1980 [JP] Japan .......................... 55-167204[U]

[51] Int. Cl.$^3$ .............................................. H03J 3/20
[52] U.S. Cl. ..................................... 334/15; 307/320; 455/283
[58] Field of Search ........... 334/15; 331/36 C, 177 V; 307/320; 332/52, 56; 455/193, 283, 289; 363/158

[56] References Cited

U.S. PATENT DOCUMENTS

| 3,101,452 | 8/1963 | Holcomb et al. | 332/56 UX |
| 3,196,368 | 7/1965 | Potter | 307/320 X |
| 3,353,126 | 11/1967 | Schucht | 331/36 C X |
| 3,391,347 | 7/1968 | Bosse et al. | 307/320 X |
| 3,400,322 | 9/1968 | Habra | 307/320 X |

*Primary Examiner*—Paul L. Gensler
*Attorney, Agent, or Firm*—Sughrue, Mion, Zinn, Macpeak, and Seas

[57] ABSTRACT

To suppress a fluctuation in resonance frequency caused by an input signal voltage in a tunable circuit, a respective capacitor is connected to each of two variable capacitance diodes connected in series-opposition.

2 Claims, 4 Drawing Figures

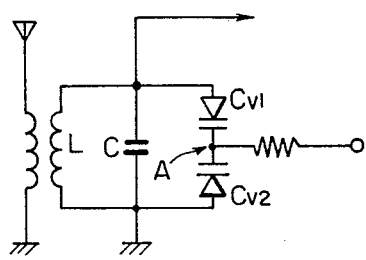
FIG. 1
PRIOR ART
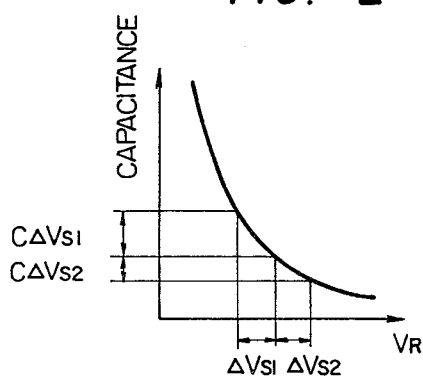
FIG. 2
FIG. 3
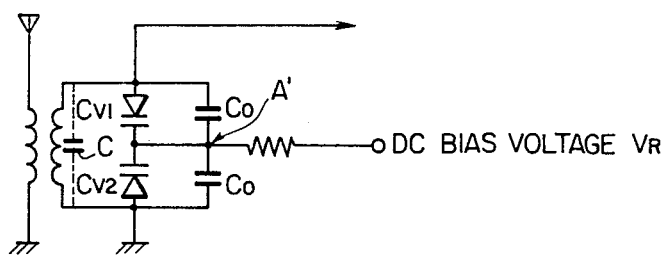
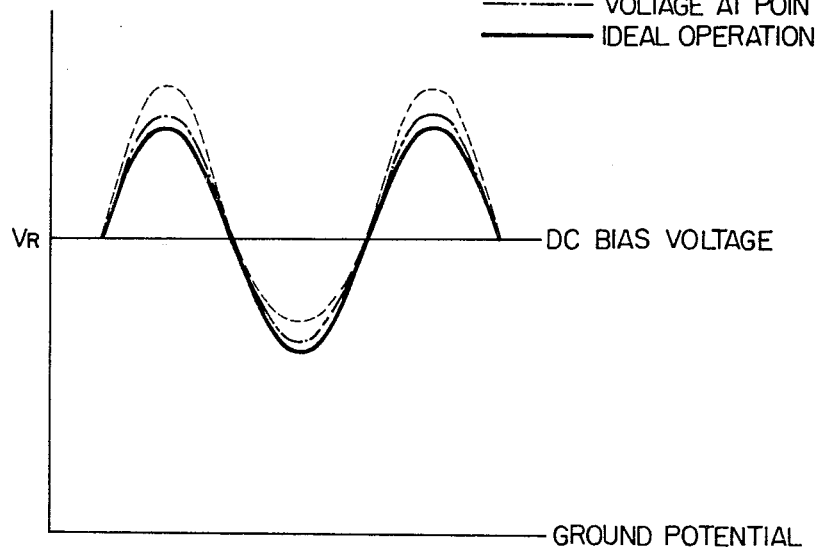
FIG. 4
-------- VOLTAGE AT POINT "A"
—·—·— VOLTAGE AT POINT "A'"
———— IDEAL OPERATIONAL MODE

TUNING CIRCUIT

BACKGROUND OF THE INVENTION

The present invention relates to a tuning circuit of an electronic tuning type receiver. More particularly, the invention relates to a tuning circuit in which the fluctuation of a resonance frequency caused by an input signal is suppressed by connecting a capacitor having a predetermined capacitance to each of two variable capacitance diodes connected in series-opposition.

Heretofore, a tuning circuit as shown in FIG. 1 is known in which variable capacitance diodes (hereinafter referred to as "Varicap diodes") $C_{v1}$ and $C_{v2}$ are connected in series-opposition and a tuning capacitor C and a tuning coil L are connected in parallel to the serially connected Varicap diodes. A d.c. bias voltage for tuning is applied to a junction point A of the Varicap diodes $C_{v1}$ and $C_{v2}$.

When a signal voltage is applied to the tuning coil L, the capacitances of the Varicap diodes $C_{v1}$ and $C_{v2}$ vary inversely with one another. That is, if the capacitance of the Varicap diode $C_{v1}$ increases, the capacitance of the Varicap diode $C_{v2}$ decreases, and vice versa. This is due to the fact that the signal voltages applied to the Varicap diodes $C_{v1}$ and $C_{v2}$ are opposite in phase in each other.

If a signal voltage $E_{in}$ is applied to the tuning coil L, the capacitances $C_1$ and $C_2$ of the Varicap diodes $C_{v1}$ and $C_{v2}$ can be expressed by the following expressions. When $E_{in} > 0$ (see FIG. 2), $$C_1 = C_{v1} + C_{\Delta vs1}$$
$$C_2 = C_{v2} - C_{\Delta vs2},$$

when $E_{in} < 0$, $$C_1 = C_{v1} - C_{\Delta vs1}$$
$$C_2 = C_{v2} + C_{\Delta vs2}$$

where $C_{v1}$ and $C_{v2}$ are the capacitances of the Varicap diodes at a predetermined reference voltage, e.g. zero volts, and $C_{\Delta vs1}$ and $C_{\Delta vs2}$ are the capacitance variations of the Varicap diodes $C_{v1}$ and $C_{v2}$.

The voltage variation at the junction point A when the signal voltage $E_{in}$ is applied can be expressed as follows:

$$A_v = \frac{C_1}{C_1 + C_2} E_{in}$$

when $E_{in} > 0$, $$A_v = \frac{C_{v1} + C_{\Delta vs1}}{C_{v1} + C_{\Delta vs1} + C_{v2} - C_{\Delta vs2}} E_{in}.$$

Since $C_{\Delta vs1} > C_{\Delta vs2}$ (as shown in FIG. 2), $$A_v > \frac{C_{v1}}{C_{v1} + C_{v2}}.$$

On the other hand, when $E_{in} < 0$, $$A_v = \frac{C_{v1} - C_{\Delta vs1}}{C_{v1} - C_{\Delta vs1} + C_{v2} + C_{\Delta vs2}} E_{in}.$$

In this case, however, since $C_{\Delta vs1} < C_{\Delta vs2}$, the following inequality can be established taking $E_{in} < 0$ into account.

$$A_v > \frac{C_{v1}}{C_{v1} + C_{v2}} E_{in}.$$

The above expressions or inequalities imply that when the signal voltage is applied, the voltage at the junction point A shifts in the positive direction as indicated by the dotted line in FIG. 4, resulting in a variation in the resonance frequency.

SUMMARY OF THE INVENTION

Accordingly, an object of this invention is to eliminate the aforementioned drawback accompanying the prior art tuning circuit and to provide an improved circuit in which the fluctuation of the resonance frequency caused by the signal voltage is suppressed.

Briefly, this object of the invention is implemented by the connection of a capacitor in parallel with each of the two Varicap diodes connected in series-opposition, with the d.c. bias voltage being applied to the junction point of the Varicap diodes.

BRIEF DESCRIPTION OF THE DRAWINGS

In the accompanying drawings:

FIG. 1 is a circuit diagram of a prior art tuning circuit;

FIG. 2 is a characteristic graph of a Varicap diode;

FIG. 3 is a circuit diagram of a tuning circuit according to this invention; and FIG. 4 is a graphical representation indicating the voltage variations at points A and A' shown in FIGS. 1 and 3 when the signal voltage is applied.

DESCRIPTION OF THE PREFERRED EMBODIMENTS

A preferred embodiment of this invention will now be described with reference to FIG. 3. In lieu of the tuning capacitor conventionally employed, a capacitor $C_0$ having a capacitance twice as large as that of the conventional capacitor is connected in parallel with each of the two Varicap diodes. Then, the voltage variation at the junction point A' of the two Varicap diodes is expressed as follows.

$$A'_v = \frac{C_0 + C_{v1} \pm C'_{\Delta vs1}}{C_0 + C_{v1} \pm C'_{\Delta vs1} + C_0 + C_{v2} \mp C'_{\Delta vs2}} E_{in}$$

where $C'_{\Delta vs1}$ and $C'_{\Delta vs2}$ are the capacitance variations in the Varicap diodes $C_{v1}$ and $C_{v2}$, respectively, caused by the signal voltage.

Since $C_o >> C'_{\Delta vs1}, C'_{\Delta vs2}$, even if $C'_{\Delta vs1}$ and $C'_{\Delta vs2}$ have the same values as $C_{\Delta vs1}$ and $C_{\Delta vs2}$ in the prior art circuit (strictly speaking, $C'_{\Delta vs1}$ and $C_{\Delta vs2}$ are slightly smaller than $C_{\Delta vs1}$ and $C_{\Delta vs2}$, respectively), the following relationship is established.

$$A'_v < A_v.$$

The voltage variation at the junction point A' will thus be indicated by one dot-dash line in FIG. 4.

As is apparent from the foregoing description, the tuning circuit according to this invention is capable of sufficiently supressing the fluctuation of the resonance frequency caused by the input signal. This means that the load variation of the tuning circuit per se is small, resulting that the distortion caused by the tuning circuit is small relative to the signal voltage $E_{in}$. In the above described embodiment, the capacitor having a capacitance twice as large as the conventional tuning capacitor is employed while removing the tuning capacitor, but it is possible to use both capacitors. In this case, the degree of suppression of the fluctuation is not the same as that shown in FIG. 4, however, it is still sufficiently advantageous to achieve the underlying object of this invention.

The tuning circuit according to this invention is applicable not only to the electronic tuning type receiver but also to other resonance circuits, such as local oscillation circuits in receivers.

What is claimed is:

1. A tuning circuit of the type including first and second variable capacitance diodes each of said diodes having first and second terminals said diodes connected in series opposition with their first terminals connected to a common connection point, means for applying a d.c. bias voltage to said common connection point between said diodes, and means for applying a signal across said second terminals of said diodes, the improvement comprising:

a first capacitor connected in parallel between said first and second terminals of said first diode; and a second capacitor connected in parallel between said first and second terminals of said second diode.

2. A tuning circuit as claimed in claim 1, further comprising a third capacitor (c) coupled across both of said diodes.

* * * * *